(12) United States Patent
Milo et al.

(10) Patent No.: US 11,761,969 B2
(45) Date of Patent: Sep. 19, 2023

(54) SYSTEM AND METHOD FOR ANALYZING A SAMPLE WITH A DYNAMIC RECIPE BASED ON ITERATIVE EXPERIMENTATION AND FEEDBACK

(71) Applicant: KLA Corporation, Milpitas, CA (US)

(72) Inventors: Renan Milo, Rishon Lezion (IL); Roie Volkovich, Hadera (IL); Anna Golotsvan, Milpitas, CA (US); Tal Yaziv, Milpitas, CA (US); Nir BenDavid, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/747,734

(22) Filed: Jan. 21, 2020

(65) Prior Publication Data

US 2021/0223274 A1 Jul. 22, 2021

(51) Int. Cl.
*G01N 35/00* (2006.01)
*G06N 20/00* (2019.01)

(52) U.S. Cl.
CPC . *G01N 35/00623* (2013.01); *G01N 35/00693* (2013.01); *G06N 20/00* (2019.01)

(58) Field of Classification Search
CPC ....... G01N 35/00623; G01N 35/00693; G01N 21/9501; G01B 11/24; G06N 20/00
USPC .................................................... 702/123, 85
See application file for complete search history.

(56) References Cited

U.S. PATENT DOCUMENTS

| | | | |
|---|---|---|---|
| 5,608,526 A | 3/1997 | Piwonda-Corle et al. | |
| 5,999,310 A | 12/1999 | Shafer et al. | |
| 6,297,880 B1 | 10/2001 | Rosencwaig et al. | |
| 7,345,825 B2 * | 3/2008 | Chuang | G02B 17/0856 359/364 |
| 7,525,649 B1 | 4/2009 | Leong et al. | |
| 7,957,066 B2 * | 6/2011 | Armstrong | G03F 7/70225 359/618 |
| 8,618,254 B2 | 12/2013 | Giaccia et al. | |
| 9,228,943 B2 * | 1/2016 | Wang | G01N 21/55 |

(Continued)

FOREIGN PATENT DOCUMENTS

KR          102028712 B1     10/2019

OTHER PUBLICATIONS

PCT International Search Report and Written Opinion for International Application No. PCT/US2021/014056 dated May 7, 2021, 6 pages.

*Primary Examiner* — Michael P Nghiem
(74) *Attorney, Agent, or Firm* — Suiter Swantz pc llo

(57) ABSTRACT

A system for analyzing one or more samples includes a sample analysis sub-system configured to perform one or more measurements on the one or more samples. The system further includes a controller configured to: receive design of experiment (DoE) data for performing the one or more measurements on the one or more samples; determine rankings for a set of target parameters; generate a recipe for performing the one or more measurements on the one or more samples based on the DoE data and the rankings of the set of target parameters; determine run parameters based on the recipe; perform the one or more measurements on the one or more samples, via the sample analysis sub-system, according to the recipe; and adjust the run parameters based on output data associated with performing the one or more measurements on the one or more samples.

25 Claims, 7 Drawing Sheets

(56) References Cited

U.S. PATENT DOCUMENTS

| | | |
|---|---|---|
| 9,279,774 B2* | 3/2016 | Romanovsky ..... G01N 21/8806 |
| 2002/0128805 A1 | 9/2002 | Goldman et al. |
| 2007/0002465 A1 | 1/2007 | Chuang et al. |
| 2009/0180176 A1 | 7/2009 | Armstrong et al. |
| 2010/0036518 A1 | 2/2010 | Funk et al. |
| 2012/0316665 A1* | 12/2012 | Nonomura .......... H01L 33/0095 |
| | | 700/97 |
| 2013/0114085 A1 | 5/2013 | Wang et al. |
| 2014/0340682 A1* | 11/2014 | Kwak .................. G01N 21/274 |
| | | 356/369 |
| 2016/0290796 A1 | 10/2016 | Levy et al. |
| 2017/0023491 A1* | 1/2017 | Cao ..................... G03F 7/70625 |
| 2017/0132352 A1* | 5/2017 | Cantwell ............. G03F 7/70633 |
| 2019/0295827 A1* | 9/2019 | Ohmori ............. H01J 37/32926 |
| 2021/0055699 A1* | 2/2021 | Agarwal .............. G01N 23/201 |
| 2021/0223274 A1* | 7/2021 | Milo .................. G01N 35/0092 |

* cited by examiner

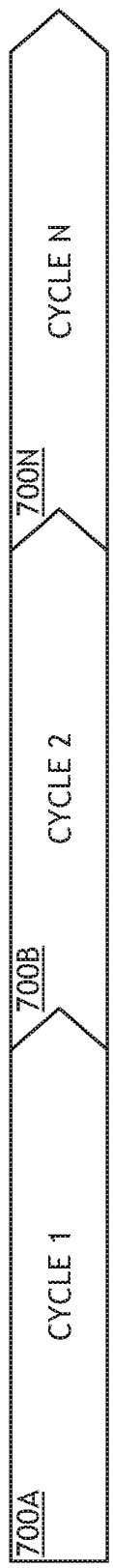
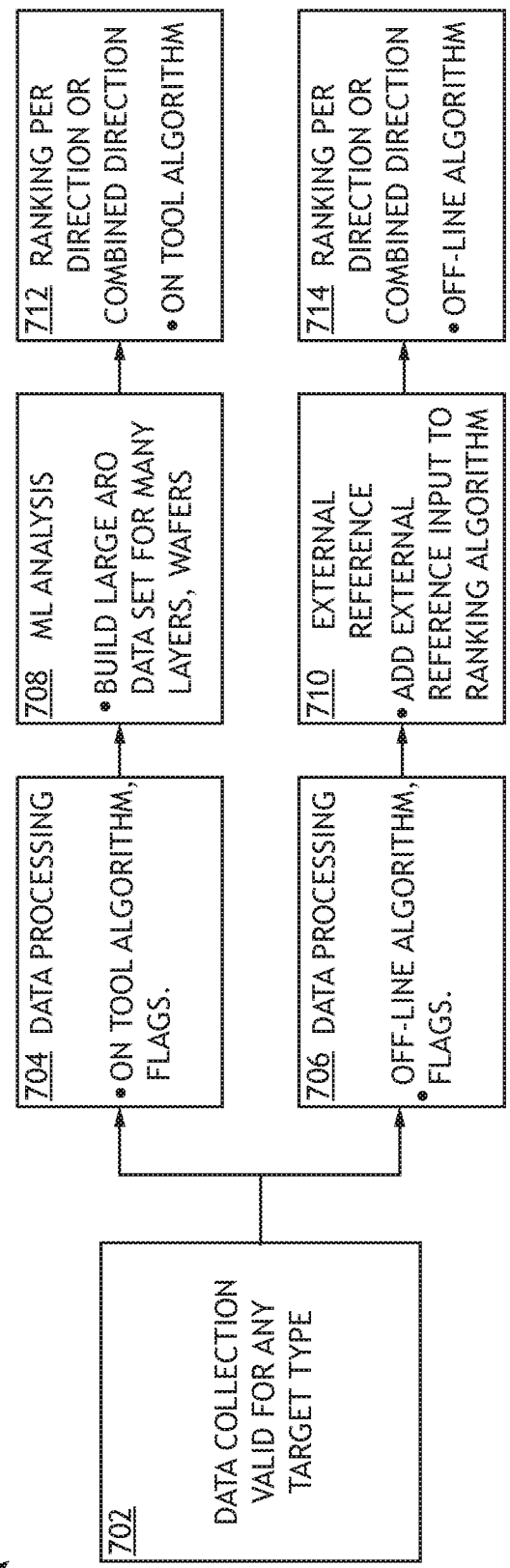
FIG. 7A
FIG. 7B

SYSTEM AND METHOD FOR ANALYZING A SAMPLE WITH A DYNAMIC RECIPE BASED ON ITERATIVE EXPERIMENTATION AND FEEDBACK

TECHNICAL FIELD

The present disclosure relates generally to systems and methods for analyzing a sample and, more particularly, to sample analysis systems and methods that employ machine learning.

BACKGROUND

Sample analysis systems (e.g., metrology/inspection systems) typically employ a static recipe structure that produces a fixed measurement condition. Based on evaluation of recipe performance, the recipe may be re-written to a new fixed condition. The same measurement mode is used every time the recipe is executed, after being optimized for shortest run time to meet productivity goals. This type of recipe does not take advantage of learning opportunities from each wafer measured on the instrument, even when it could be held longer and probed for alternative recipe conditions.

SUMMARY

A system for analyzing one or more samples is disclosed in accordance with one or more illustrative embodiments of the present disclosure. In one illustrative embodiment, the system includes a sample analysis sub-system and at least one controller communicatively coupled to the sample sub-system. The sample sub-system is configured to perform one or more measurements on the one or more samples. In embodiments, the controller may be configured to receive design of experiment (DoE) data for performing the one or more measurements on the one or more samples. In embodiments, the controller may be further configured to determine rankings for a set of target parameters. In embodiments, the controller may be further configured to generate a recipe for performing the one or more measurements on the one or more samples based on the DoE data and the rankings of the set of target parameters. In embodiments, the controller may be further configured to determine run parameters based on the recipe. In embodiments, the controller may be further configured to perform the one or more measurements on the one or more samples, via the sample analysis sub-system, according to the recipe. In embodiments, the controller may be further configured to adjust the run parameters based on output data associated with performing the one or more measurements on the one or more samples.

A controller for a sample analysis sub-system is also disclosed in accordance with one or more illustrative embodiments of the present disclosure. In one illustrative embodiment, the controller includes one or more processors and at least one computer-readable medium communicatively coupled to the one or more processors. The computer-readable medium may have program instructions stored thereon. In embodiments, the program instructions, when executed by the one or more processors, may be configured to cause the one or more processors to: receive DoE data for performing one or more measurements on the one or more samples; determine rankings for a set of target parameters; generate a recipe for performing the one or more measurements on the one or more samples based on the DoE data and the rankings of the set of target parameters; determine run parameters based on the recipe; perform the one or more measurements on the one or more samples, via the sample analysis sub-system, according to the recipe; and adjust the run parameters based on output data associated with performing the one or more measurements on the one or more samples.

A method of analyzing one or more samples is also disclosed in accordance with one or more illustrative embodiments of the present disclosure. In one illustrative embodiment, the method includes steps of: receiving DoE data for performing the one or more measurements on the one or more samples; determining rankings for a set of target parameters; generating a recipe for performing the one or more measurements on the one or more samples based on the DoE data and the rankings of the set of target parameters; determining run parameters based on the recipe; performing the one or more measurements on the one or more samples according to the recipe; and adjusting the run parameters based on output data associated with performing the one or more measurements on the one or more samples.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 7A is a flow diagram illustrating data collection and processing cycles of an ARO process, in accordance with one or more embodiments of the present disclosure; and FIG. 7B is a flow diagram illustrating a data collection and processing cycle of an ARO process, in accordance with one or more embodiments of the present disclosure.

DETAILED DESCRIPTION

Figure 1:
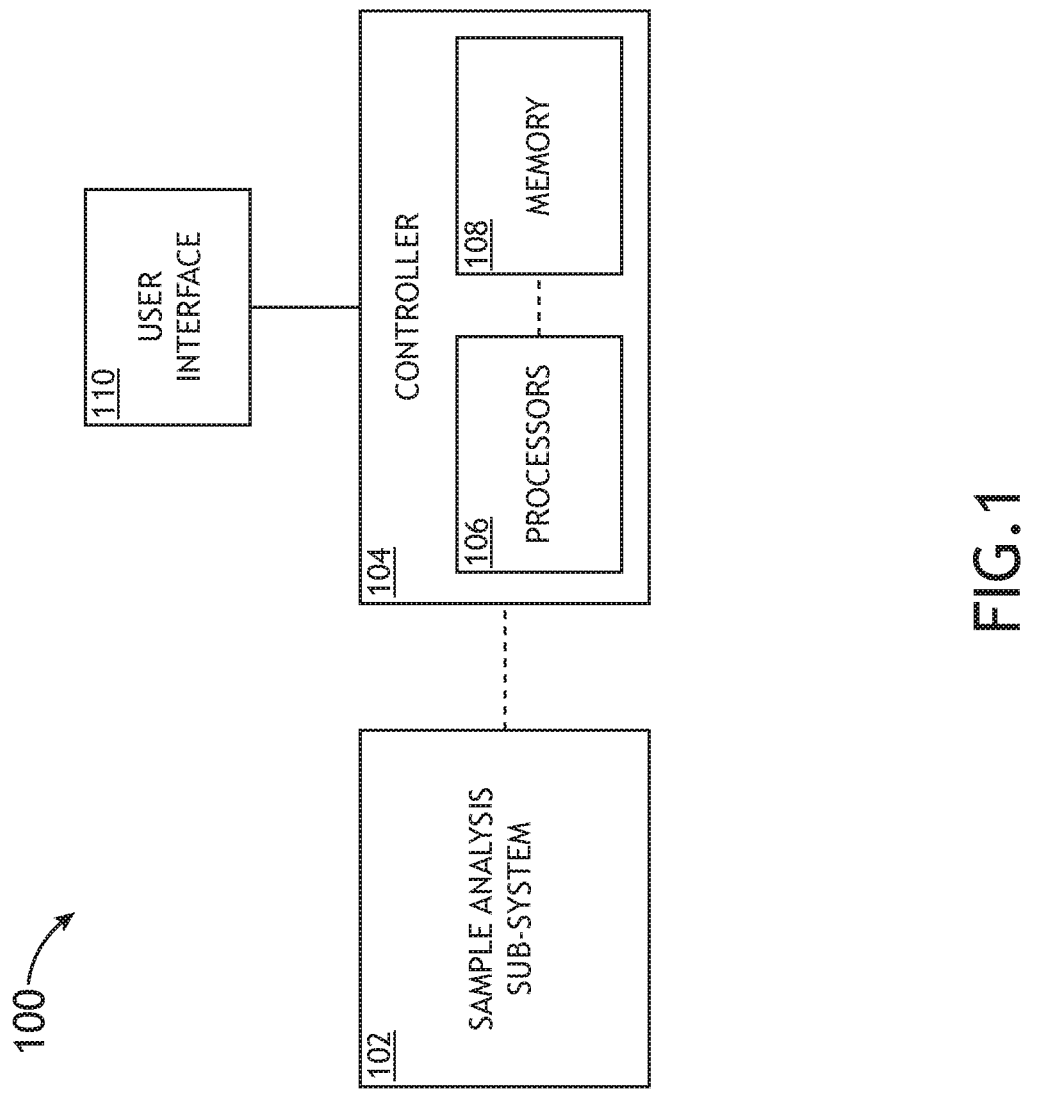
FIG. 1 is a block diagram illustrating a system for analyzing a sample with a dynamic recipe based on iterative experimentation and feedback, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Sample analysis systems (e.g., metrology/inspection systems) typically employ a static recipe structure that produces a fixed measurement condition. Based on evaluation of recipe performance, the recipe may be rewritten to a new fixed condition. The same measurement mode is used every time the recipe is executed, after being optimized for shortest run time to meet productivity goals.

This type of recipe does not take advantage of learning opportunities from each wafer measured on the instrument, even when it could be held longer and probed for alternative recipe conditions. In addition, indicators of measurement performance (e.g., in the case of overlay, residuals and correlation to reference) are not stored and processed systematically as inputs for automatic adjustment of recipe parameters and of experimental design in future runs.

Furthermore, in previous methods for automatic recipe optimization (ARO), significant modification of the software is required for the implementation of new ranking algorithms and/or the addition of new parameter optimizations, reference data, target types or any other related information. This can have a major impact on implementation time. The previous methods also lack the option of using external data (e.g., reference data) as an input to the ranking decision tree.

To overcome one or more of the limitations of the existing recipe techniques discussed above, this disclosure presents systems and methods based on a recipe flow with gradual convergence, using feedback and reference, to optimize a flexible measurement run. In embodiments, the disclosed systems and methods may employ a run manager that dynamically selects wavelengths, targets, and so forth according to recipe-defined DoE priority. The systems and methods may also allow for flexibility within customer-set limits (e.g., a typical constraint would be time per lot). The systems and methods may employ feedback using recipe run history (e.g., previous results, tool parameters, run parameters, etc.) and may also rely on external reference data (e.g., user-input data, pre-determined/pre-defined data, and/or data from another process/tool).

The recipe flow described herein results in a learning system that has built-in flexibility and evolves with process maturity and accumulated experience. Some features of the disclosed systems and methods may include, but are not limited to: a dynamic recipe structure that defines an experimental plan to be applied according to constraints (e.g., time, process maturity, etc.); an on-tool run manager that optimizes/improves measurement conditions for every run based on accumulated learning and user-defined flexibility; and a feedback mechanism that stores and analyzes results from each run and applies them to a learning algorithm that serves as input to the run manager.

Systems and methods for automatic recipe optimization (ARO) technique are also disclosed. In embodiments, the disclosed systems and methods may employ modular building box formalism to improve results performance and accuracy, time to results, and enable flexibility in the development of recipes and final recipes ranking. The disclosed techniques may be applied to overlay (OVL) measurements, but can also be used for any other metrology and/or inspection measurements.

FIG. 1 illustrates a system 100 for analyzing one or more characteristics of a sample (a wafer, board, panel, reticle, or the like) with a dynamic recipe based on iterative experimentation and feedback, in accordance with one or more embodiments of the present disclosure. The system 100 may include at least one sample analysis subsystems 102 (e.g., metrology/inspection system). The system 100 may further include at least one controller 104 including one or more processors 106 and memory 108. In embodiments, the controller 104 may include or may be communicatively coupled to a user interface 110.

The sample analysis sub-system 102 may include any sample analysis sub-system 102 known in the art including, but not limited to, an optical metrology/inspection system, a charged particle-based metrology/inspection system, or the like. In embodiments, the controller 104 is communicatively coupled to the sample analysis sub-system 102. In this regard, the one or more processors 106 of the controller 104 may be configured to generate one or more control signals to adjust one or more characteristics/parameters of the sample analysis sub-system 102.

Figure 2:
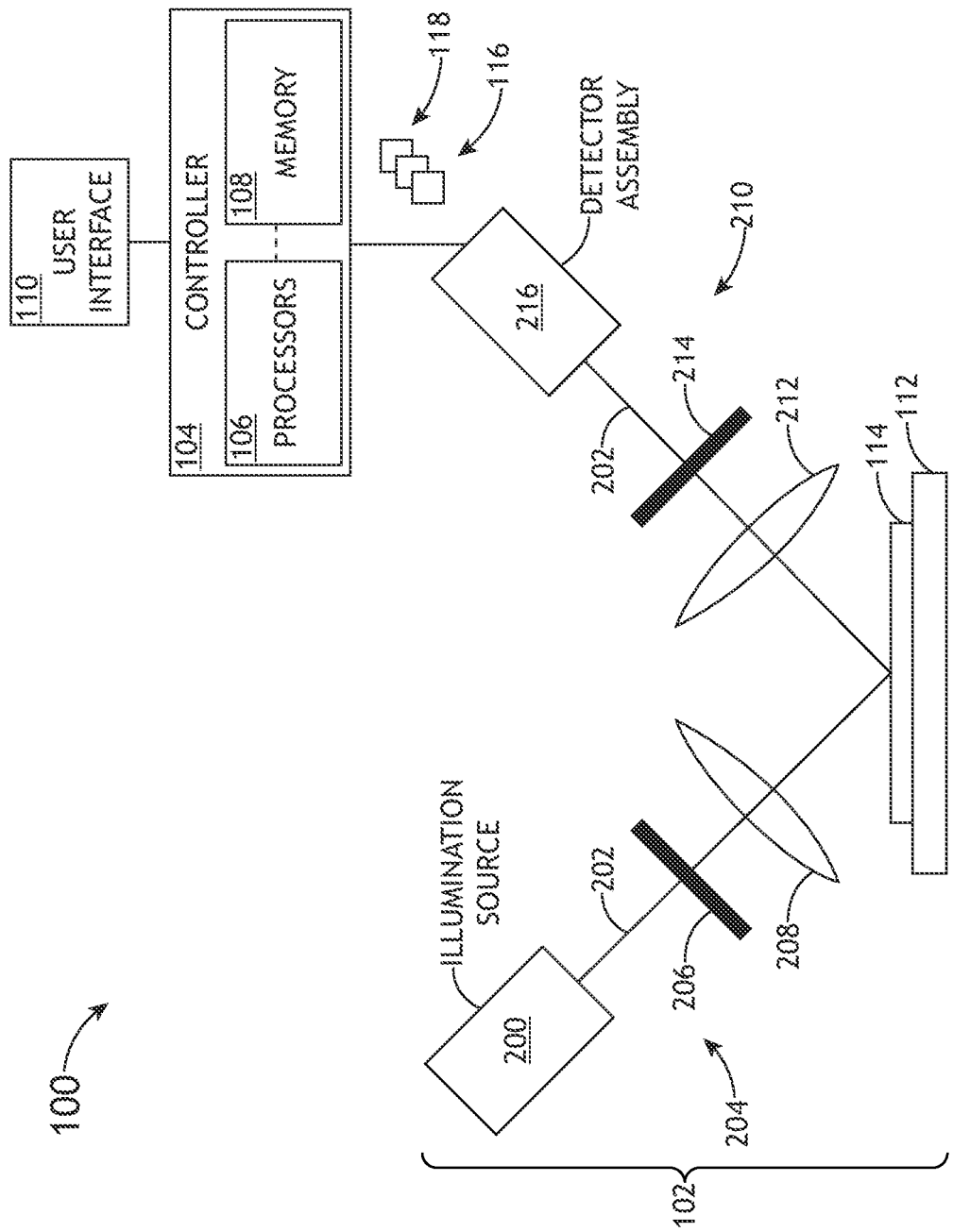
FIG. 2 is a block diagram illustrating a sample analysis sub-system (e.g., a metrology sub-system), in accordance with one or more embodiments of the present disclosure.

FIG. 2 illustrates a simplified schematic diagram of a sample analysis sub-system 102 arranged in a reflectometry and/or ellipsometry configuration, in accordance with one or more embodiments of the present disclosure. It is noted that the various embodiments and components described with respect to FIG. 3 may be interpreted to extend to the system of FIG. 2, and vice versa. The sample analysis sub-system 102 may include any type of metrology system known in the art.

In an embodiment, the sample analysis sub-system 102 includes an illumination source 200, an illumination arm 204, a collection arm 210, and a detector assembly 216. Illumination 202 from the illumination source 200 may be directed to a sample 114 via the illumination arm 204. The sample analysis sub-system 102 may be configured to collect illumination emanating from the sample via the collection arm 210. The illumination arm 204 pathway may include one or more optical elements 206 suitable for modifying and/or conditioning the illumination 202. For example, the one or more optical elements 206 may include, but are not limited to, one or more polarizers, one or more filters, one or more beam splitters, one or more diffusers, one or more homogenizers, one or more apodizers, one or more beam shapers, one or more lenses, or any combination thereof.

The illumination arm 204 may utilize a first focusing element 208 to focus and/or direct the illumination 202 (e.g., beam) onto the sample 114. In some embodiments, the sample 114 is disposed upon a stage assembly 112. The collection arm 210 may include a second focusing element 212 to collect illumination from the sample 114.

In embodiments, the detector assembly 216 is configured to capture illumination emanating from the sample 114 through the collection arm 210. For example, the detector assembly 216 may receive illumination reflected or scattered (e.g., via specular reflection, diffuse reflection, and the like) from the sample 114. By way of another example, the detector assembly 216 may receive illumination generated by the sample 114 (e.g., luminescence associated with absorption of the illumination 202, and the like). It is noted that detector assembly 216 may include any sensor and detector assembly known in the art. The sensor may include, but is not limited to, CCD detector, a CMOS detector, a TDI detector, a PMT, an APD, and the like.

The collection arm 210 may further include collection optics 214 to direct and/or modify illumination collected by the second focusing element 212 including, but not limited to, one or more lenses, one or more filters, one or more polarizers, or one or more phase plates.

The sample analysis sub-system 102 may be configured as any type of metrology tool known in the art such as, but not limited to, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer, a single-wavelength reflectometer, an angle-resolved reflectometer (e.g., a beam-profile reflectometer), an imaging system, a pupil imaging system, a spectral imaging system, or a scatterometer.

A description of an inspection/metrology tools suitable for implementation in the various embodiments of the present disclosure are provided in U.S. Pat. No. 9,279,774, entitled "Wafer Inspection System," issued on Mar. 8, 2016; U.S. Pat. No. 7,957,066, entitled "Split Field Inspection System Using Small Catadioptric Objectives," issued on Jun. 7, 2011; U.S. Pat. No. 7,345,825, entitled "Beam Delivery System for Laser Dark-Field Illumination in a Catadioptric Optical System," issued on Mar. 18, 2008; U.S. Pat. No. 5,999,310, entitled "Ultra-broadband UV Microscope Imaging System with Wide Range Zoom Capability," issued on Dec. 7, 1999; U.S. Pat. No. 7,525,649 entitled "Surface Inspection System Using Laser Line Illumination with Two Dimensional Imaging," issued on Apr. 28, 2009; U.S. Pat. No. 9,228,943, entitled "Dynamically Adjustable Semiconductor Metrology System," by Wang et al. issued on Jan. 5, 2016; U.S. Pat. No. 5,608,526, entitled "Focused Beam Spectroscopic Ellipsometry Method and System, by Piwonka-Corle et al., issued on Mar. 4, 1997; and U.S. Pat. No. 6,297,880, entitled "Apparatus for Analyzing Multi-Layer Thin Film Stacks on Semiconductors," by Rosencwaig et al., issued on Oct. 2, 2001, which are each incorporated herein by reference in their entirety.

Figure 3:
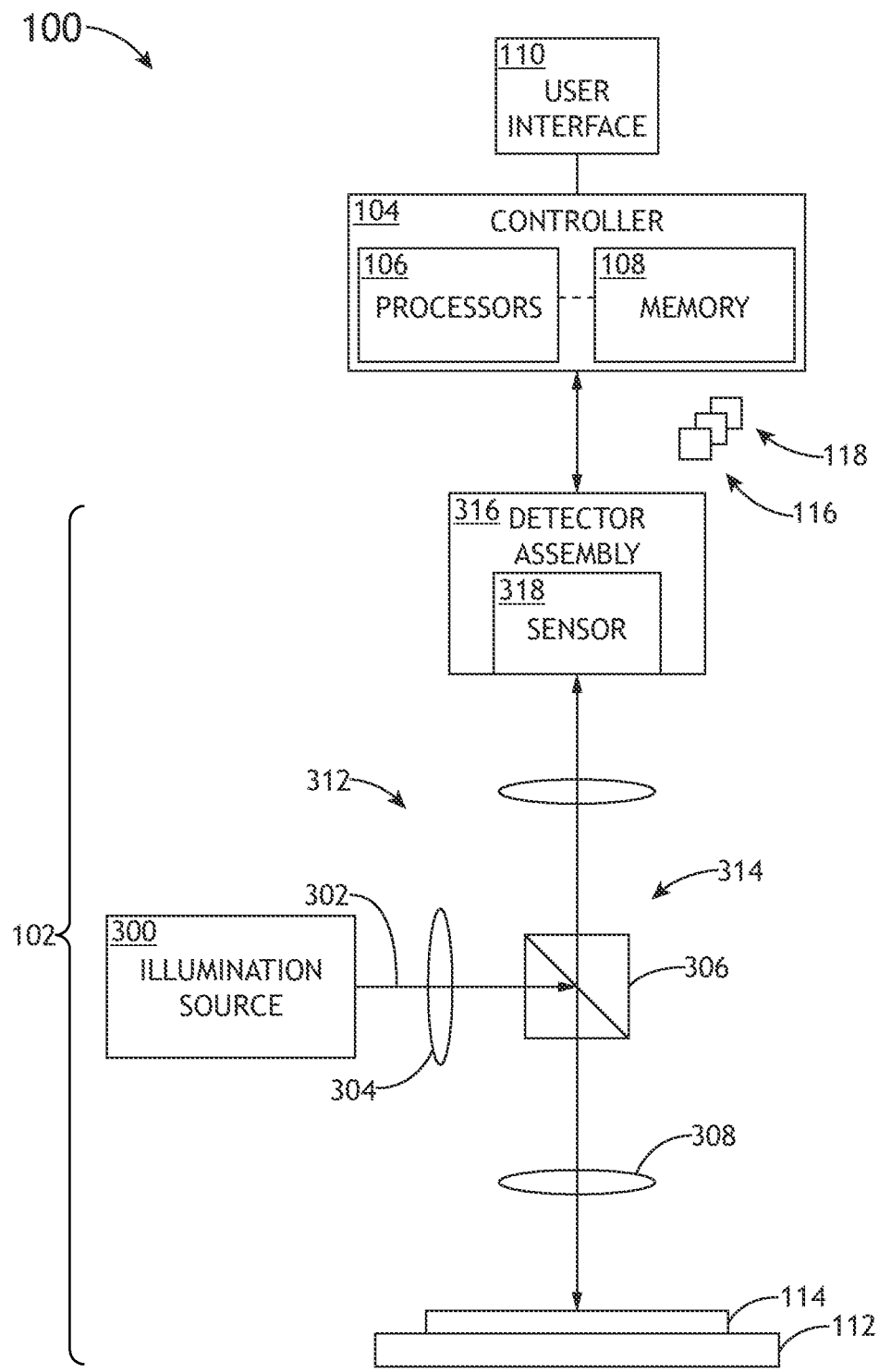
FIG. 3 is a block diagram illustrating a sample analysis sub-system (e.g., an inspection sub-system), in accordance with one or more embodiments of the present disclosure.

FIG. 3 illustrates a simplified schematic diagram of a sample analysis sub-system 102 arranged in an optical characterization (e.g., inspection) system configuration, in accordance with one or more embodiments of the present disclosure. It is noted that the various embodiments and components described with respect to FIG. 2 may be interpreted to extend to the system of FIG. 3, and vice versa. The sample analysis sub-system 102 may include any type of metrology system known in the art. The sample analysis sub-system 102 may comprise any inspection, imaging, or other characterization system known in the art. In this regard, the sample analysis sub-system 102 may be configured to perform inspection, and/or any form of measurement/imaging on a sample 114. The sample 114 may include any sample known in the art including, but not limited to, a wafer, a reticle/photomask, or the like. In an embodiment, the sample analysis sub-system 102 includes an illumination source 300, an illumination arm 312, a collection arm 314, and a detector assembly 316.

The sample 114 may be disposed on a stage assembly 112 to facilitate movement of sample 114. Stage assembly 112 may include any stage assembly 112 known in the art including, but not limited to, an X-Y stage, an R-θ stage, and the like. In another embodiment, stage assembly 112 is capable of adjusting the height of sample 114 during inspection or imaging to maintain focus on the sample 114.

The illumination arm 312 may be configured to direct illumination 302 from the illumination source 300 to the sample 114. The illumination arm 312 may include any number and type of optical components known in the art. In one embodiment, the illumination arm 312 includes one or more optical elements 304, a beam splitter 306, and an objective lens 308. In this regard, illumination arm 312 may be configured to focus illumination 302 from the illumination source 300 onto the surface of the sample 114. The one or more optical elements 304 may include any optical element or combination of optical elements known in the art including, but not limited to, one or more mirrors, one or more lenses, one or more polarizers, one or more gratings, one or more filters, one or more beam splitters, or any combination thereof.

The collection arm 314 may be configured to collect light reflected, scattered, diffracted, and/or emitted from sample 114. In embodiments, the collection arm 314 may direct and/or focus the light from the sample 114 to a sensor 318 of a detector assembly 316. It is noted that sensor 318 and detector assembly 316 may include any sensor and detector assembly known in the art. The sensor 318 may include, but is not limited to, a charge-coupled device (CCD) detector, a complementary metal-oxide semiconductor (CMOS) detector, a time-delay integration (TDI) detector, a photomultiplier tube (PMT), an avalanche photodiode (APD), or the like. Further, sensor 318 may include, but is not limited to, a line sensor or an electron-bombarded line sensor.

It is noted herein that the one or more components of system 100 may be communicatively coupled to the various other components of system 100 in any manner known in the art. For example, the illumination source 200/300, detector assembly 216/316, stage assembly 112, etc., may be communicatively coupled to controller 104 and/or one another via a wireline (e.g., copper wire, fiber optic cable, and the like) or wireless connection (e.g., RF coupling, IR coupling, data network communication (e.g., WiFi, WiMax, Bluetooth and the like).

As noted previously herein, the controller 104 of system 100 may include one or more processors 106 and memory 108. The memory 108 may include program instructions configured to cause the one or more processors 106 to carry out various steps of the present disclosure. For example, the program instructions may be configured to cause the one or more processors 106 to adjust one or more characteristics of the sample analysis sub-system 102 in order to perform one or more measurements on the sample 114 and to carry out recipe and tool control and optimization operations/steps described herein (e.g., with reference to FIGS. 4 through 7B).

In embodiments, the one or more processors 106 may include any one or more processing elements known in the art. In this sense, the one or more processors 106 may include any microprocessor-type device configured to execute software algorithms and/or instructions. For example, a controller 104/processor 106 may comprise a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 106. In general, the term "processor" may be broadly defined to encompass any device having one or more processing elements, which execute program instructions from memory 108. Moreover, different subsystems of the system 100 (e.g., sample analysis sub-system 102, or any portion thereof) may include processor or logic elements suitable for carrying out at least a portion of the steps described throughout the present disclosure. Therefore, the above description should not be interpreted as a limitation on the present disclosure but merely an illustration.

The memory 108 may include any storage medium known in the art suitable for storing program instructions executable by the associated one or more processors 106 and the data received from the inspection sub-system 102. For example, the memory 108 may include a non-transitory computer-readable medium. For instance, the memory 108 may include, but is not limited to, a read-only memory (ROM), a random-access memory (RAM), a magnetic or optical memory device (e.g., disk), a magnetic tape, a solid-state drive and the like. It is further noted that memory 108 may be housed in a common controller housing with the one or more processors 106. In an alternative embodiment, the memory 108 may be located remotely with respect to the physical location of the processors 106, controller 104, and the like. The memory 108 may store program instructions for causing the one or more processors 106 to carry out the various operations/steps described through the present disclosure.

In some embodiments, a user interface 110 is communicatively coupled to the controller 104. In embodiments, the user interface 110 may include, but is not limited to, one or more desktops, tablets, smartphones, smart watches, or the like. In other embodiments, the user interface 110 includes a display used to display data of the system 100 to a user. The display of the user interface 110 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 110 is suitable for implementation in the present disclosure. In another embodiment, a user may input selections and/or instructions responsive to data displayed to the user via a user input device (e.g., keyboard, mouse, touchscreen, touch pad, touch panel, microphone, etc.) of the user interface 110.

Figure 4:
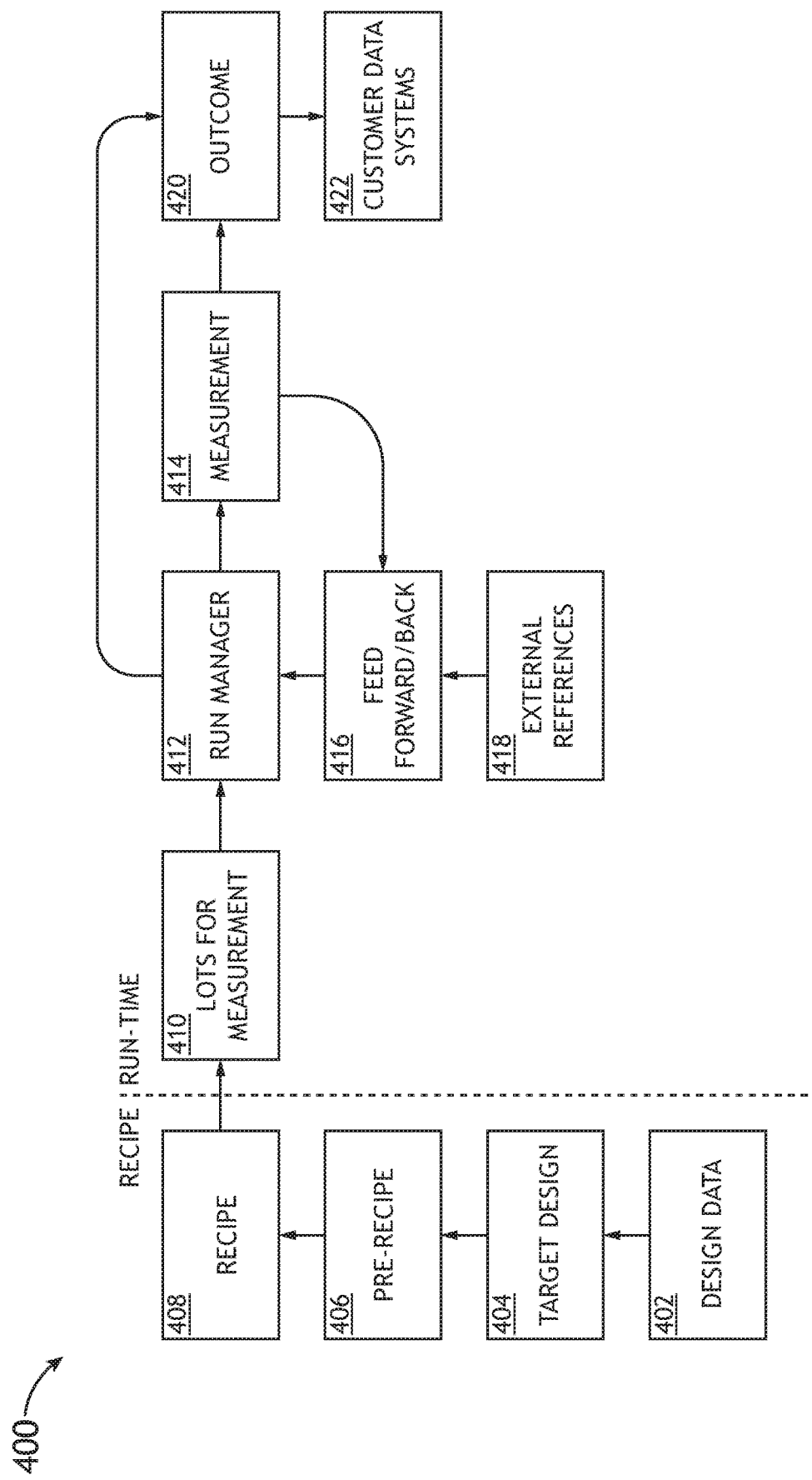
FIG. 4 is a flow diagram illustrating a method of analyzing a sample with a dynamic recipe based on iterative experimentation and feedback, in accordance with one or more embodiments of the present disclosure.

FIG. 4 is a flow diagram illustrating a method 400 of analyzing a sample with a dynamic recipe based on iterative experimentation and feedback, in accordance with one or more embodiments of the present disclosure. It is noted that the embodiments and enabling technologies described previously herein in the context of system 100 should be interpreted to extend to method 400. In this regard, the steps of method 400 may be carried out by system 100, and the method 400 may further include one or more steps required or implied by the architecture of system 100. However, the method 400 is not limited to the architecture of system 100, and it is recognized that one or more steps of method 400, or portions thereof, may be carried out with alternative system components and/or architecture. Furthermore, the steps of method 400 can be carried out in any order unless otherwise specified herein.

At step 402, the controller 104 may receive design of experiment (DoE) data (e.g., stack information, alignment marks, etc.) for performing the one or more measurements on the one or more samples (e.g., for one or more individual samples or one or more lots). In some embodiments, the DoE data is manually input (e.g., via user interface 110). In other embodiments, the DoE data may be uploaded/downloaded or otherwise received from another device, local server, or remote server in communication with the controller 104.

At step 404, the controller 104 may determine rankings for a set of target parameters (e.g., run-time, accuracy, etc.). In some embodiments, the rankings are manually assigned (e.g., via user interface 110). In other embodiments, the rankings may be determined based on results, historical data, and/or data received from another device, local server, or remote server in communication with the controller 104.

At step 406, the controller 104 may perform one or more pre-recipe operations to tune the sample analysis sub-system. For example, the controller 104 may be configured to perform a tool parameter calibration procedure and/or tool parameter calibration test, such as a tool geometry calibration procedure/test, a tool alignment calibration procedure/test, a tool focus calibration procedure/test, or the like.

At step 408, the controller 104 may generate a recipe for performing the one or more measurements on the one or more samples based on the DoE data and the rankings of the set of target parameters. For example, the controller 104 may be configured to generate a recipe that permits flexibility within the DoE constraints and according to the priority of the target parameters. At this stage, the controller 104 may be further configured to generate decision logic for subsequent steps/operations.

At step 410, one or more samples are provided for measurement. For example, one or more samples or lots of samples may be loaded onto the tool (e.g., the sample analysis sub-system 102). In some embodiments, the samples or lots are manually loaded onto the tool. In other embodiments, an automation system including one or more actuatable components (e.g., conveyers, robotic arms, etc.) is configured to load the sample or lots of samples onto the tool for measurement.

At step 412, the controller 104 (operating as the run manager) may determine run parameters based on the recipe. For example, the controller 104 may be configured to define run parameters and data convergence flow per sample or per lot based on the recipe generated at step 408. The run parameters may include, but are not limited to, illumination parameters, target parameters, optical parameters, spatial parameters, scan sequences, actuation sequences, or any combination thereof.

At step 414, the controller 104 (operating as the run manager) may perform one or more measurements on the one or more samples (e.g., sample 114), via the sample analysis sub-system 102, according to the recipe. For example, the controller 104 may be configured to collect overlay measurements, any other metrology measurements, or images from the one or more samples 114. This collected data 116 and/or associated tool data 118 can be used to help optimize the recipe and/or tool setting (e.g., as discussed with regard to step 416).

At step 416, the controller 104 may adjust the run parameters based on output data (e.g., collected data 116 and/or associated tool data 118) associated with performing the one or more measurements on the one or more samples. For example, the controller 104 may be configured to perform a feed forward or feedback algorithm to adjust one or more of the run parameters and/or the recipe based on the output data. In some embodiments, the output data may include, but is not limited to, current measurements, historical measurements, current run parameters, historical run parameters, or any combination thereof.

At step 418, the controller 104 may further adjust the run parameters based on external reference data. For example, the controller 104 may be configured to receive external reference data as an input to the feed forward or feedback algorithm utilized to adjust one or more of the run parameters and/or the recipe. In some embodiments, the external reference data may include user-input reference data (e.g., input via the user interface 110). In other embodiments, the external reference data may be uploaded/downloaded or otherwise received from another device, local server, or remote server in communication with the controller 104.

At step 420, the controller 104 may report the measurement results. For example, the controller 104 may be configured to report the measurement results via the user interface 110 and/or configured to transmit the results to another device, local server, or remote server in communication with the controller 104. In some embodiments, the results are transmitted to a customer data system (step 422).

Figure 5:
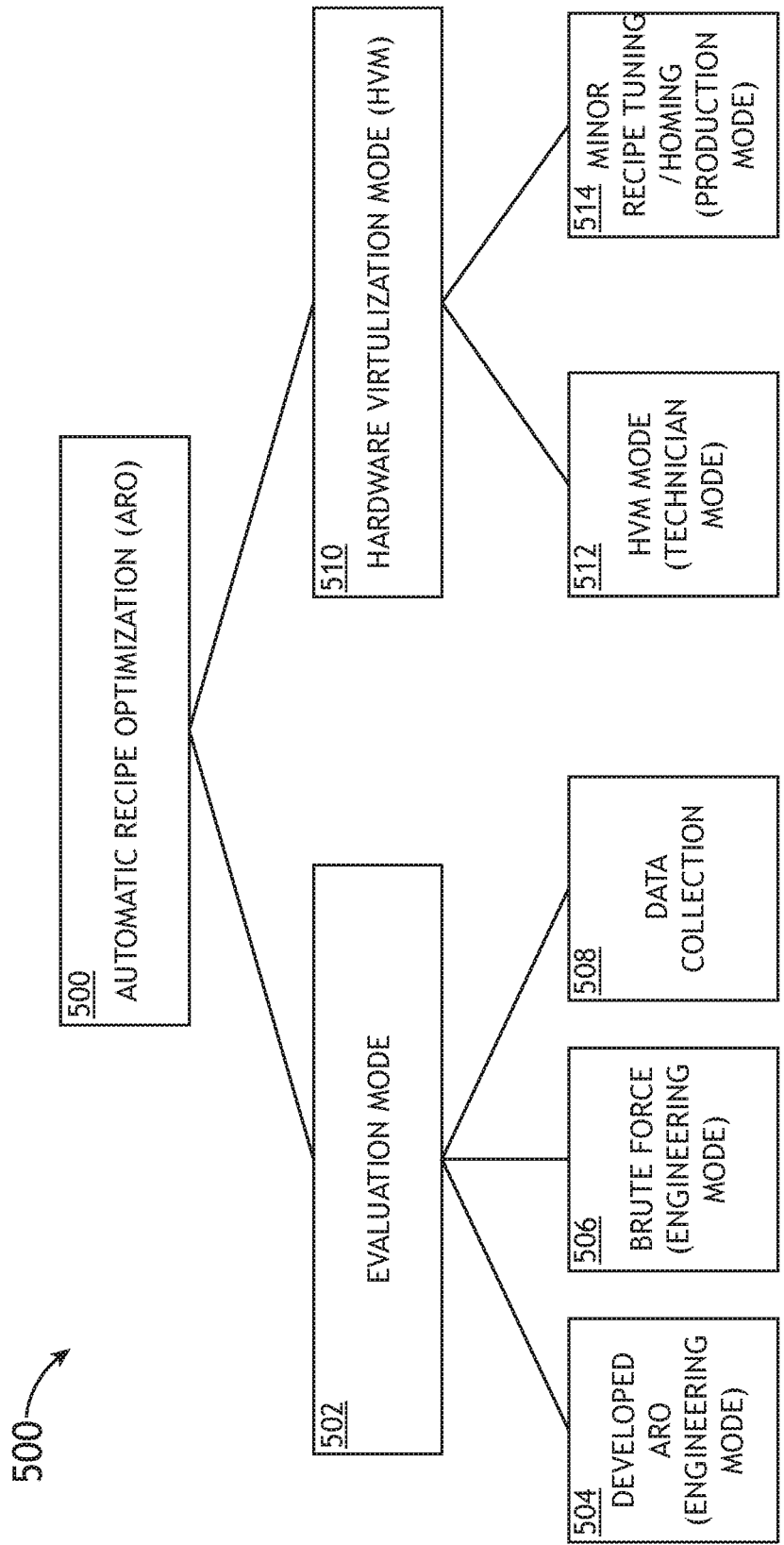
FIG. 5 is a hierarchical diagram illustrating an automatic recipe optimization (ARO) system, in accordance with one or more embodiments of the present disclosure.

FIG. 5 is a hierarchical diagram illustrating an automatic recipe optimization (ARO) platform 500, in accordance with one or more embodiments of the present disclosure. The goals of ARO divided between two major use cases: an evaluation mode 502 and a hardware virtualization mode (HVM) 510. In embodiments, the controller 104 is configured to adjust the recipe for performing the one or more measurements on the one or more samples 114 in either of the evaluation mode 502 or the HVM 510.

In the evaluation mode 502 the process is still finalized with further research and development occurring. During this stage time, the limitation for recipe setup is more relaxed and additional development can be performed. The evaluation mode 502 may be further broken down into a developed ARO engineering mode 504, a brute force engineering mode 506, and a data collection mode 508. In mode 504, tool developed recipes are tested (and modified per programmable logic controller (PLC) phase) to generate a developed flow, accuracy flags, and to reduce sampling. In some embodiments, the duration of mode 504 may be defined by HVM specifications. In mode 506, the feasibility of recipes developed in mode 504 can be tested and improved and tool entitlement processes may be performed for larger sampling, many tool parameters/controls, and so forth. In some embodiments, the duration of mode 506 may be defined by HVM specifications. In mode 508, data collection for future development may occur. In some embodiments, mode 508 has an indeterminate duration, and the controller 104 may continue to data collection operations (mode 508) even after entering HVM 510.

After the process is stable, the ARO platform 500 can operate in the HVM 510. The HVM 510 may be further broken down into a HVM technician mode 512 and a minor recipe tuning/homing production mode 514. In mode 512, on-tool recipes are updated/replaced with recipes generated in the evaluation mode 502 (e.g., via ARO engineering mode 504). In some embodiments, the duration of mode 512 may be in the range of at least 2 hours per target, or any other appropriate/necessary duration of time. In mode 514, minor modifications may be made to the recipes and/or one or more tool parameters may be adjusted. In some embodiments, the duration of mode 514 may be on the order of several minutes, or any other appropriate/necessary duration of time.

Figure 6:
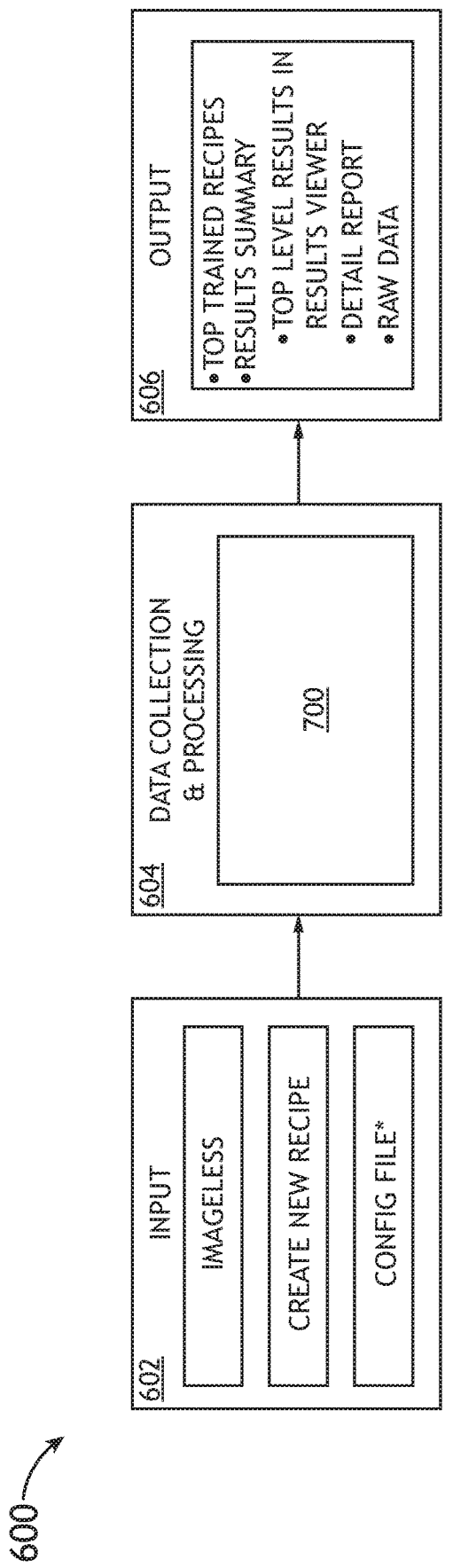
FIG. 6 is a flow diagram illustrating an ARO process, in accordance with one or more embodiments of the present disclosure.

FIG. 6 is a flow diagram illustrating an ARO process 600, in accordance with one or more embodiments of the present disclosure. The process 600 may include an input stage 602, a data collection and processing stage 604 (including one or more processing cycles 700), and an output stage 606 where top trained recipes and results are reported (e.g., via user interface 110 or to another device/system).

As shown in FIG. 7A, the data collection and processing stage 604 may include one cycles or several cycles (e.g., cycles 700A, 700B, . . . 700N, etc.), depending on the complexity of the ARO, process, layers, and device. In embodiments, each cycle may be divided into a measurements portion, data processing, and ranking.

FIG. 7B is a flow diagram illustrating a data collection and processing cycle 700, in accordance with one or more embodiments of the present disclosure. In embodiments, each cycle includes several building blocks. The number of cycles, order of building blocks and content of building block may be configurable using a config file. Ranking is fully configurable and can use one parameter or several parameters with flexible combination. After data collection (block 702), data processing (blocks 704 and 706) and ranking (blocks 712 and 714) may be performed on each direction separately. At blocks 704 and 706, respectively, controller 104 may be configured to adjust the recipe based on an on-tool data processing algorithm and/or an off-tool data processing algorithm. At blocks 712 and 714, respectively, the controller 104 may be further configured to rank one or more recipe parameters of the recipe based on at least one of an on-tool ranking algorithm or an off-tool ranking algorithm. Block 708 for machine learning (ML) can be used for improving the data processing & analysis step and to improve ranking. Various blocks can also be added easily with off-line tools or on tool software. Block 710 can be used to add input from CDSEM, DOE wafers, simulations, or any other external reference. In this regard, the controller 104 may be further configured to adjust the recipe based on ML analysis and/or based on external reference data.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system for analyzing one or more samples, comprising:
   a sample analysis sub-system configured to perform one or more measurements on the one or more samples; and
   at least one controller communicatively coupled to the sample analysis sub-system, the at least one controller configured to:

receive design of experiment (DoE) data for performing the one or more measurements on the one or more samples;

determine rankings for a set of target parameters;

generate a recipe for performing the one or more measurements on the one or more samples based on the DoE data and the rankings for the set of target parameters;

execute a run manager configured to determine one or more run parameters of the sample analysis sub-system based on the recipe, wherein the run manager dynamically selects one or more wavelengths and one or more targets based on DoE priority defined by the recipe, wherein the run manager is configured to adjust the one or more run parameters of the sample analysis sub-system for each run, wherein the one or more run parameters for each run are applied to a learning algorithm, and an output of the learning algorithm serves as an input to the run manager; and perform the one or more measurements on the one or more samples, via the sample analysis sub-system according to the one or more run parameters from the run manager.

2. The system of claim 1, wherein the at least one controller is further configured to perform one or more pre-recipe operations to tune the sample analysis sub-system.

3. The system of claim 2, wherein the one or more pre-recipe operations include at least one of a tool parameter calibration procedure or a tool parameter calibration test.

4. The system of claim 1, wherein the at least one controller is further configured to adjust at least one run parameter of the one or more run parameters based on external reference data.

5. The system of claim 4, wherein the external reference data comprises user-input reference data.

6. The system of claim 1, wherein the one or more run parameters include at least one of an illumination parameter, a target parameter, an optical parameter, a spatial parameter, a scan sequence, or an actuation sequence.

7. The system of claim 1, wherein the output includes at least one of a current measurement, a historical measurement, a current run parameter, or a historical run parameter.

8. The system of claim 1, wherein the sample analysis sub-system comprises a metrology system.

9. The system of claim 1, wherein the at least one controller is further configured to adjust the recipe for performing the one or more measurements on the one or more samples in either of an evaluation mode or a hardware virtualization mode.

10. The system of claim 9, wherein the at least one controller is configured to adjust the recipe based on at least one of an on-tool data processing algorithm or an off-tool data processing algorithm.

11. The system of claim 1, wherein the at least one controller is further configured to adjust the recipe based on external reference data.

12. The system of claim 1, wherein the at least one controller is further configured to rank one or more recipe parameters of the recipe based on at least one of an on-tool ranking algorithm or an off-tool ranking algorithm.

13. A controller for a sample analysis sub-system, comprising:

one or more processors; and at least one computer-readable medium communicatively coupled to the one or more processors, the at least one computer-readable medium storing program instructions that, when executed by the one or more processors, are configured to cause the one or more processors to:

receive design of experiment (DoE) data for performing one or more measurements on the one or more samples;

determine rankings for a set of target parameters;

generate a recipe for performing the one or more measurements on one or more samples based on the DoE data and the rankings for the set of target parameters;

execute a run manager configured to determine one or more run parameters of the sample analysis sub-system based on the recipe, wherein the run manager dynamically selects one or more wavelengths and one or more targets based on DoE priority defined by the recipe, wherein the run manager is configured to adjust the one or more run parameters of the sample analysis sub-system for each run, wherein the one or more run parameters for each run are applied to a learning algorithm, and an output of the learning algorithm serves as an input to the run manager; and perform the one or more measurements on the one or more samples, via the sample analysis sub-system according to the one or more run parameters from the run manager.

14. The controller of claim 13, wherein the program instructions are further configured to cause the one or more processors to perform one or more pre-recipe operations to tune the sample analysis sub-system.

15. The controller of claim 14, wherein the one or more pre-recipe operations include at least one of a tool parameter calibration procedure or a tool parameter calibration test.

16. The controller of claim 13, wherein the program instructions are further configured to cause the one or more processors to adjust the one or more run parameters based on external reference data.

17. The controller of claim 16, wherein the external reference data comprises user-input reference data.

18. The controller of claim 13, wherein the one or more run parameters include at least one of an illumination parameter, a target parameter, an optical parameter, a spatial parameter, a scan sequence, or an actuation sequence.

19. The controller of claim 13, wherein the output includes at least one of a current measurement, a historical measurement, a current run parameter, or a historical run parameter.

20. The controller of claim 13, wherein the sample analysis sub-system comprises a metrology system.

21. The controller of claim 13, wherein the program instructions are further configured to cause the one or more processors to adjust the recipe for performing the one or more measurements on the one or more samples in either of an evaluation mode or a hardware virtualization mode.

22. The controller of claim 21, wherein the program instructions are configured to cause the one or more processors to adjust the recipe based on at least one of an on-tool data processing algorithm or an off-tool data processing algorithm.

23. The controller of claim 13, wherein the program instructions are further configured to cause the one or more processors to adjust the recipe based on external reference data.

24. The controller of claim 13, wherein the program instructions are further configured to cause the one or more processors to rank one or more recipe parameters of the recipe based on at least one of an on-tool ranking algorithm or an off-tool ranking algorithm.

25. A method of analyzing one or more samples, comprising:

receiving design of experiment (DoE) data for performing one or more measurements on the one or more samples;

determining rankings for a set of target parameters;

generating a recipe for performing the one or more measurements on the one or more samples based on the DoE data and the rankings for the set of target parameters;

executing a run manager to determine one or more run parameters of a sample analysis sub-system based on the recipe, wherein the run manager dynamically selects one or more wavelengths and one or more targets based on DoE priority defined by the recipe, wherein the run manager is configured to adjust the one or more run parameters of the sample analysis sub-system for each run, wherein the one or more run parameters for each run are applied to a learning algorithm, and an output of the learning algorithm serves as an input to the run manager; and performing the one or more measurements on the one or more samples, via the sample analysis sub-system according to the one or more run parameters from the run manager.

* * * * *